United States Patent
Lin et al.

(10) Patent No.: US 8,333,822 B2
(45) Date of Patent: *Dec. 18, 2012

(54) POLYMERIC POLYMER CONTAINING POLY(OXYETHYLENE)-AMINE AND APPLICATION THEREOF TO PREPARING SILVER NANOPARTICLE

(75) Inventors: Jiang-Jen Lin, Taipei (TW); Wei-Cheng Tsai, Taipei (TW); Rui-Xuan Dong, Taipei (TW); Wei-Li Lin, Taipei (TW); Chao-Po Hsu, Taipei (TW)

(73) Assignee: National Taiwan University, Taipei (TW)

( * ) Notice: Subject to any disclaimer, the term of this patent is extended or adjusted under 35 U.S.C. 154(b) by 240 days.

This patent is subject to a terminal disclaimer.

(21) Appl. No.: 12/843,050

(22) Filed: Jul. 26, 2010

(65) Prior Publication Data
US 2011/0024699 A1 Feb. 3, 2011

(30) Foreign Application Priority Data
Jul. 28, 2009 (TW) ................................ 98125408 A

(51) Int. Cl.
*B22F 9/24* (2006.01)
(52) U.S. Cl. .......................... 75/371; 977/896
(58) Field of Classification Search .......................... None
See application file for complete search history.

(56) References Cited

U.S. PATENT DOCUMENTS

| | | | | |
|---|---|---|---|---|
| 4,663,050 A * | 5/1987 | Li et al. | ......................... | 210/649 |
| 6,060,215 A * | 5/2000 | Amanokura et al. | ....... | 430/281.1 |
| 6,699,648 B2 * | 3/2004 | Sakizadeh et al. | ............ | 430/350 |
| 8,013,048 B2 * | 9/2011 | Lin et al. | ...................... | 524/440 |
| 2008/0178763 A1* | 7/2008 | Schwartz et al. | .......... | 106/31.13 |
| 2009/0305132 A1* | 12/2009 | Gauthier et al. | .............. | 429/207 |
| 2009/0306306 A1* | 12/2009 | Ohkido et al. | ................ | 525/410 |

OTHER PUBLICATIONS

Vivek, A.V. et al., "Synthesis of Silver Nanoparticles Using a Novel Graft Copolymer and Enhanced Particle Stability via a 'Polymer Brush Effect'", Macromolecular Rapid Communications, vol. 29, No. 9, pp. 737-742, 2008.*

* cited by examiner

*Primary Examiner* — George Wyszomierski
(74) *Attorney, Agent, or Firm* — Pai Patent & Trademark Law Firm; Chao-Chang David Pai

(57) ABSTRACT

A polymeric polymer containing poly(oxyethylene)-amine and its application to preparation of silver nanoparticles. The polymeric polymer is prepared from poly(oxyethylene)-amine and a linker, for example, poly(styrene-co-maleic anhydride) (SMA) or dianhydride. The polymeric polymer can chelate silver ions and reduce them to silver atoms which are dispersed as nanoparticles. No additional reducing agent is needed and more than 30% of solid content of the nanoparticles solution can be achieved without aggregation. The prepared silver nanoparticles are both hydrophilic and hydrophobic and therefore are compatible with polymers.

14 Claims, 7 Drawing Sheets

POLYMERIC POLYMER CONTAINING POLY(OXYETHYLENE)-AMINE AND APPLICATION THEREOF TO PREPARING SILVER NANOPARTICLE

BACKGROUND OF THE INVENTION

1. Field of the Invention

The present invention relates to a polymeric polymer, particularly to a polymeric polymer containing poly(oxyethylene)-amine, and application thereof to preparing silver nanoparticles. The silver nanoparticles can be further used for manufacturing electric devices, biomedicines, silver nanowires, silver paste, composites and polymer-type surfactants.

2. Related Prior Art

So far, methods for producing silver nanoparticles are classified into physical methods and chemical methods. The physical method usually demands expensive equipment for highly-vacuum vaporization or e-beam. The chemical method uses reducers to reduce the silver ions as atoms and then a stabilizer is used to control the size of the particles. Representative reducers include $NaBH_4$, formaldehyde, alcohol, hydrazine ($H_2N-NH_2$), and the like. Representative stabilizers include sodium citrate, glucose, sodium dodecyl sulfate, polyvinyl pyrrolidone (PVP), dendrimer, and the like.

To be applied to germproof, pharmaceutical, biomedicine and electric devices, the silver particles must have high specific area and be at nanoscale. Therefore, aggregation of the particles should be prevented, and organic dispersants or stabilizers are added to achieve this. Functions of the dispersants include electrostatic repulsion and steric hindrance or barrier, as described below.

(1) Electrostatic Repulsion

When organic dispersants are adsorbed onto the same charged surfaces of inorganic particles, Coulomb's electrostatic force will prevent the particles from aggregation. If anions on the surfaces are replaced with neutral ions, the surface charges will decrease and the particles will aggregate due to van der Waal force. In addition, high concentration or ionic strength of the prepared nanoparticle solutions often encounter the problem of lower stability, which can be overcome by using a dispersant with increased dielectric strength or electric double layers for improved stability.

(2) Steric Hindrance or Barrier

When organic molecules (serving as protectors) are adsorbed on surfaces of metal particles and prevent aggregation of the particles, steric hindrance to particle collision in rendering stability is achieved.

Some stabilizers known in the art are disclosed in reports. In J. Phys. Chem. B 1998, 102, 10663-10666, sodium polyacrylateor polyacrylamide was provided as a stabilizer. In Chem. Mater. 2005, 17, 4630-4635, thioalkylated poly(ethylene glycol) was provided as a stabilizer. In J. Phys. Chem. B1999, 103, 9533-9539, sodium citrate was provided as a stabilizer. In Langmuir 1996, 12, 3585-3589, nonionic surfactants were provided as stabilizers. In Langmuir 1997, 13, 1481-1485, $NaBH_4$ was provided as a reducing agent and anionic, cationic and nonionic surfactant were provided as stabilizers. In Langmuir 1999, 15, 948-951, 3-aminopropyl-trimethoxysilane (APS) was provided as a stabilizer and N,N-dimethyl-formamide was a reducing agent.

In addition, poly(oxyethylene) compounds (POE) can be a reducing agent of metallic ions but concentrations of the metallic ions must be low. In J. Phys. Chem. 1999, 99, 475-478, PEG having different molecular weights were discussed about their reducing ability to gold ions. The reaction formula was as follows:

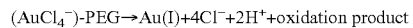

In J. Colloid Interface Sci. 2002, 255, 299-302, PEG having different molecular weights, dimethylacetamide (DMAC), acetonenitrile and water were compared about their reducing ability to silver ions and sizes of the prepared particles. In J. Phys. Chem. B 2005, 109, 7766-7777, the copolymer of poly(oxypropylene) (POP) and POE reduced gold ions into gold particles according to the following reaction:

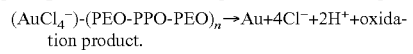

As described above, the traditional method for stabilizing Ag particles is to add surfactants or stabilizers. However, the solutions of such Ag particles have solid contents less than 10% and cannot be in the form of silver paste, or have a higher solid content with aggregation.

Conventional chemical methods require the use of organic solvents, salts or reducing agents for long-term and complex redox reactions, which result in high cost. Moreover, concentrations of the silver ions have to be lowered to ppm scale during operation or the silver particles will aggregate and perform undesired effects. Accordingly, there remains a need for developing more efficient and cost effective methods for preparing silver nanoparticles.

SUMMARY OF THE INVENTION

The object of the present invention is to provide a polymeric polymer containing poly(oxyethylene)-amine which can be applied to preparing silver nanoparticles in moderate conditions, so that other reducing agent is not necessary and the solid content of the silver nanoparticles can be increased to more than 30 wt % without aggregation.

The polymeric polymer containing poly(oxyethylene)-amine of the present invention has one of the following structural formulae:

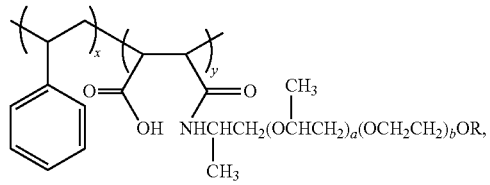

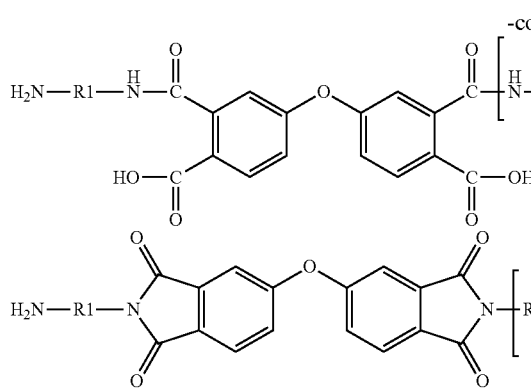 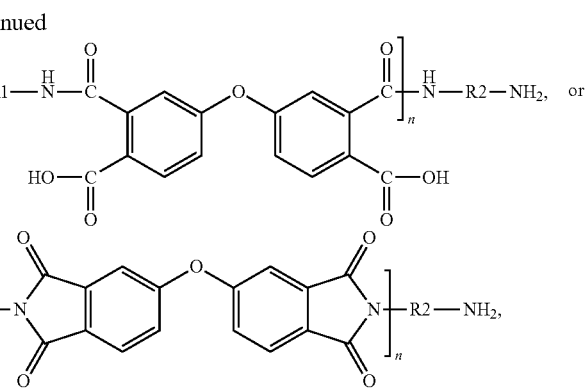

wherein
x/y=1/1~11/1, a=10, b=32, R=CH$_3$,

R1 =
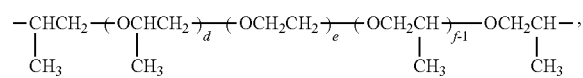

R2 =
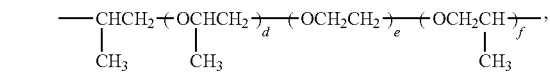

and
d+f=6, e=38.7, n=0~99.

The method for preparing poly(oxyethylene)-amine of the present invention include a step of synthesizing a polymeric polymer from poly(oxyalkylene)-amine and a linker. The linker can be poly(styrene-co-maleic anhydride) (SMA) or dianhydride, and poly(oxyalkylene)-amine contains at least one reductive poly(oxyalkylene) segment.

Poly(oxyalkylene)-amine can include oxyethylene (EO) and/or oxypropylene (PO) segments. Poly(oxyalkylene)-amine can be poly(oxyalkylene)-monoamine, poly(oxyethylene)-diamine or poly(oxyalkylene)-triamine.

The general formula of poly(oxyethylene)-monoamine is R—NH$_2$ and has the following structural formula:

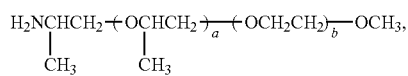

wherein a=0~10, b=10~50.

An example of poly(oxypropylene-oxyethylene)-monoamine is Jeffamine® M2070 of Huntsman Chemical Co. or Aldrich Chemical Co., which has an average molecular weight 2,000 and a=10, b=32 in the above structural formula.

The general formula of poly(oxyethylene)-diamine is H$_2$N—R—NH$_2$ and has the following structural formula:

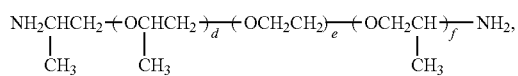

wherein e=10~50, d or f=0~10.

An example of poly(oxypropylene-oxyethylene-oxypropylene)-diamine is Jeffamine® ED-2003 of Huntsman Chemical Co. or Aldrich Chemical Co., which has an average molecular weight 2,000 and d+f=6, e=38.7 in the above structural formula.

Other examples of poly(oxyalkylene)-amine are listed in ATTACHMENT 1.

The linker is preferably SMA having a molecular weight ranging from 5,000 to 150,000 or phenyl dianhydride, for example, 3,3',4,4'-benzophenone tetracarboxylic dianhydride (BTDA), pyromellitic dianhydride (PMDA), 3,3',4,4'-biphenyl tetracarboxylic (s-BPDA), 4,4'-(hexafluoroisopropylidene)diphthalic anhydride (6FDA), 4,4'-oxydiphthalic dianhydride (ODPA), 3,3',4,4'-diphenylsulfone tetracarboxylic dianhydride (DSDA), 4,4'-biphenol A dianhydride (BPADA) and hydroquinone diphthalic anhydride (HQDA); wherein 4,4'-oxydiphthalic dianhydride (ODPA) is more preferred.

The SMA series of the present invention have the following structural formula:

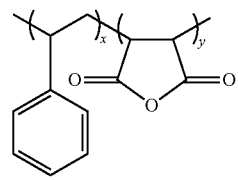

|  | approx. ratio | approx. Mw |
| --- | --- | --- |
| SMA 1000 | x/y = 1/1 | 6000 |
| SMA 2000 | x/y = 2/1 | 6000 |
| SMA 3000 | x/y = 3/1 | 6000 |
| SMA 6000 | x/y = 6/1 | 120000 |
| SMA 11000 | x/y = 11/1 | 140000 |

The dianhydride series compounds of the present invention are listed in ATTACHMENT 2.

The molar ratio of the amino group of poly(oxyalkylene)-amine to the anhydride group of SMA ranges from 1/1 to 1/5; and preferably from 1/1.5 to 1/2.5.

The molar ratio of the amino group of poly(oxyalkylene)-amine to the anhydride group of dianhydride ranges from 2/1 to 1/5.

The reaction time for preparing silver nanoparticles preferably ranges from 2 to 24 hours. If the linker is SMA, the reaction temperature preferably ranges from 15 to 50° C. If the linker is dianhydride, the reaction temperature preferably ranges from 0 to 200° C.

The above reaction can be performed in a first solvent. The first solvent can be tetrahydrofurane (THF), N-methyl-2-pyrrolidone (NMP), dimethyl formamide (DMF), toluene, acetone, propylene glycol monomethyl ether acetate (PGMEA) or methyl-ethyl Ketone (MEK).

The method for preparing silver nanoparticles of the present invention includes a step of reacting the above polymeric polymer and the silver ions in a second solvent to reduce the silver ions into silver atoms which are dispersed as silver nanoparticles.

The silver ions can be provided from any suitable compounds, for example, silver nitrate, AgI, AgBr, AgCl or silver pentafluoropropionate. The weight ratio of polymeric polymer/$AgNO_3$ ranges from 1/99 to 99/1. The second solvent can be water, DMF, NMP or tetrahydrofurane (THF). When a part or all of the second solvent is removed, the solid content of the silver nanoparticles can reach to 30~100 wt %. The silver nanoparticles having high solid contents can be further dispersed in an organic solvent.

ATTACHMENTS

ATTACHMENT 1 shows the poly(oxyalkylene)-amines used in the present invention.
ATTACHMENT 2 shows the dianhydrides used in the present invention.
ATTACHMENT 3 shows the solubilities of ODPA/ED2003 amide copolymers in different solvents.
ATTACHMENT 4 shows the operation conditions and results of Examples and Comparative Examples.

DETAILED DESCRIPTION OF THE PREFERRED EMBODIMENTS

In the present invention, poly(oxyalkylene)-amines and the linker react to generate polymeric polymers. Through the reactions, functional groups, for example, carboxylic acid, amide, multiple amine and amidoamine, are formed and can strongly chelate with silver ions. Therefore, the silver nanoparticles are more stable and compatible with water or organic solvents without aggregation.

Detailed procedures of Examples and Comparative Examples are described as follows. These examples are not intended to limit the scope of the invention.

Example 1

Step (A) Synthesizing Polymeric Polymer SMA/M2070

Figure 1:
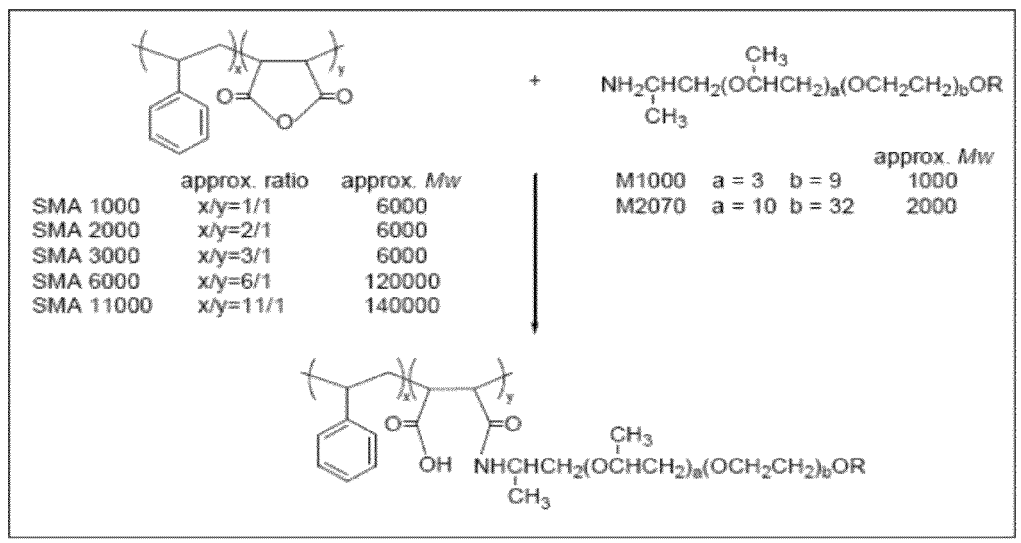
FIG. 1 shows the reaction scheme for synthesizing SMA2000/M2070 amide copolymer.

SMA and M2070 were dewatered in vacuum at 120° C. for 6 hours. Then M2070 (130.4 g, 65.2 mmol) was placed in a three-necked bottle, and SMA2000 (10.0 g, including 32.6 mmol MA, dissolved in 50 mL THF) was added therein by several batches. To avoid cross-linking, excess M2070 was added in a double equivalent to SMA. During the reaction, the mixture was sampled for GPC and IR analysis to ensure that cross-linking did not occur. The reaction is shown in FIG. 1. The synthesized polymers were in a mixture which was subsequently separated with a mixed solvent including ethanol and water (or toluene). The unreacted M2070 was dissolved in the mixed solvent and SMA2000-M2070 was precipitated.

Step (B) Synthesizing Silver Nanoparticles

In a round-bottom flask, SMA2000-M2070 (5 g) was dissolved in water (50 g) and mixed by a magnetic stirrer. $AgNO_3$ (2 g) was then added and lighted with visible light. Through the self-reductive reaction of EO segments, the silver nanoparticles were generated. With increasing concentration of the silver nanoparticles, the solution became brown from light yellow. The UV analysis showed that the silver nanoparticles were generated according to characteristic absorption thereof at wavelength 460 nm.

Figure 2:
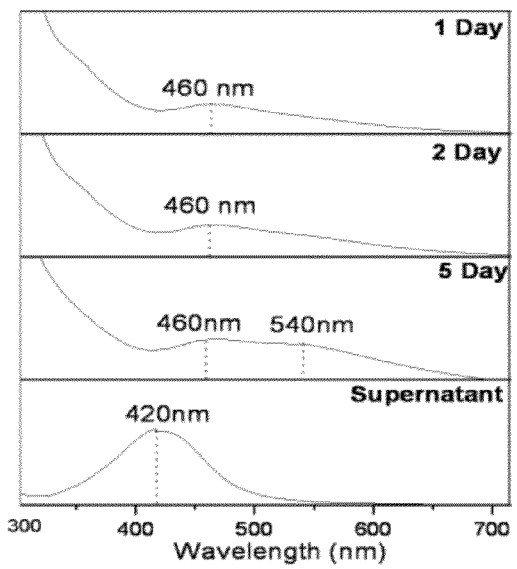
FIG. 2 shows the relationships between UV absorbances and reaction time of the silver nanoparticles prepared from SMA2000/M2070 amide copolymer.
Figure 3:
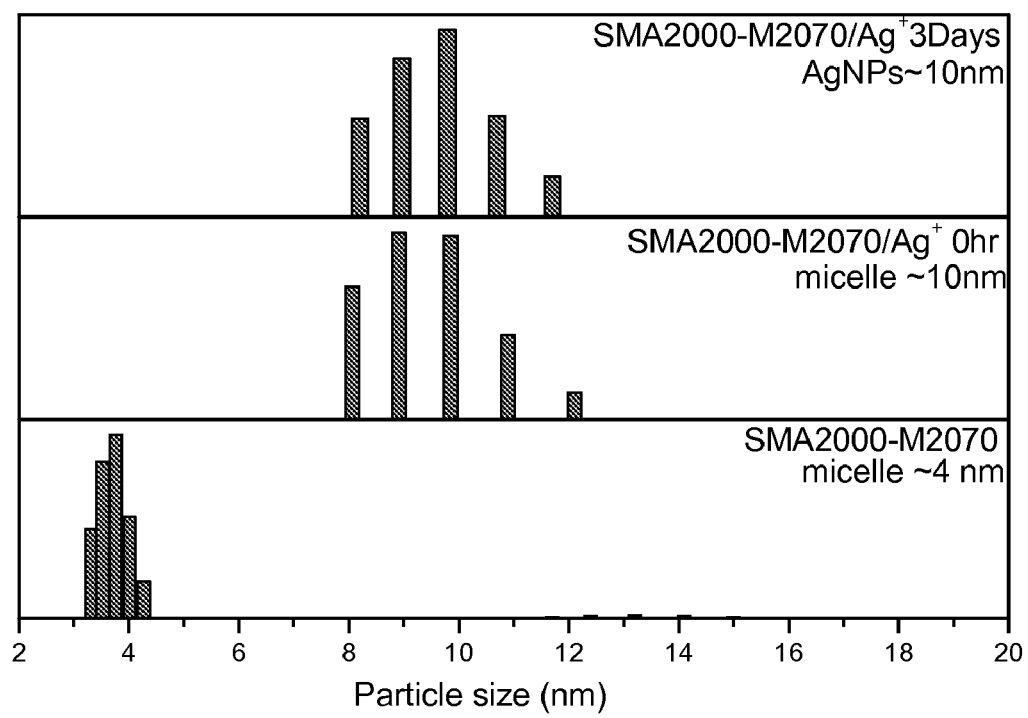
FIG. 3 and FIG. 4 show the particle sizes and the TEM image of the silver nanoparticles prepared from SMA2000/M2070 amide copolymer.
Figure 4:
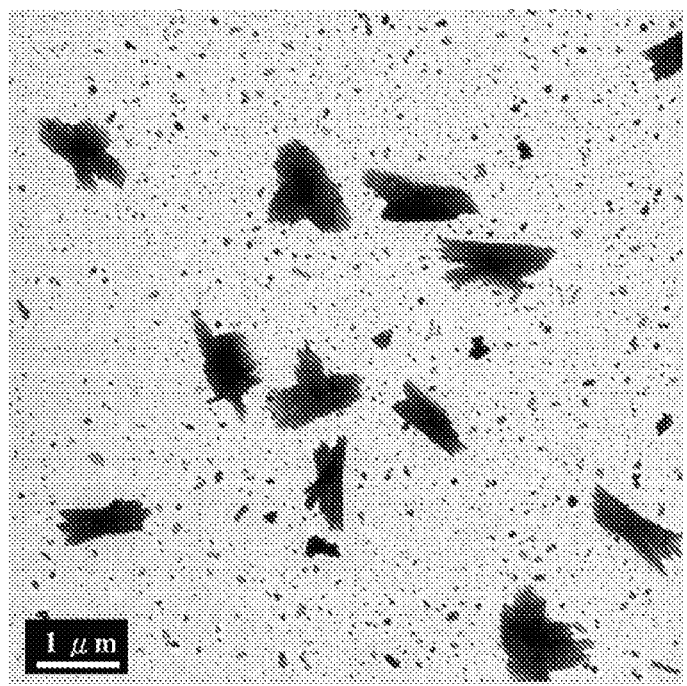

FIG. 2 shows the relationship between UV-visible absorbance and reaction time, in which a peak at 540 nm was observed after reaction for five days. Particle sizes of the silver nanoparticles changed with reaction time. FIG. 3 shows the particle sizes of the silver nanoparticles prepared from SMA2000/M2070 amide copolymer. FIG. 4 shows the TEM image of the silver nanoparticles after five days.

Example 2

Step (A) Synthesizing Polymeric Amide Copolymer ODPA/ED2003

Figure 5:
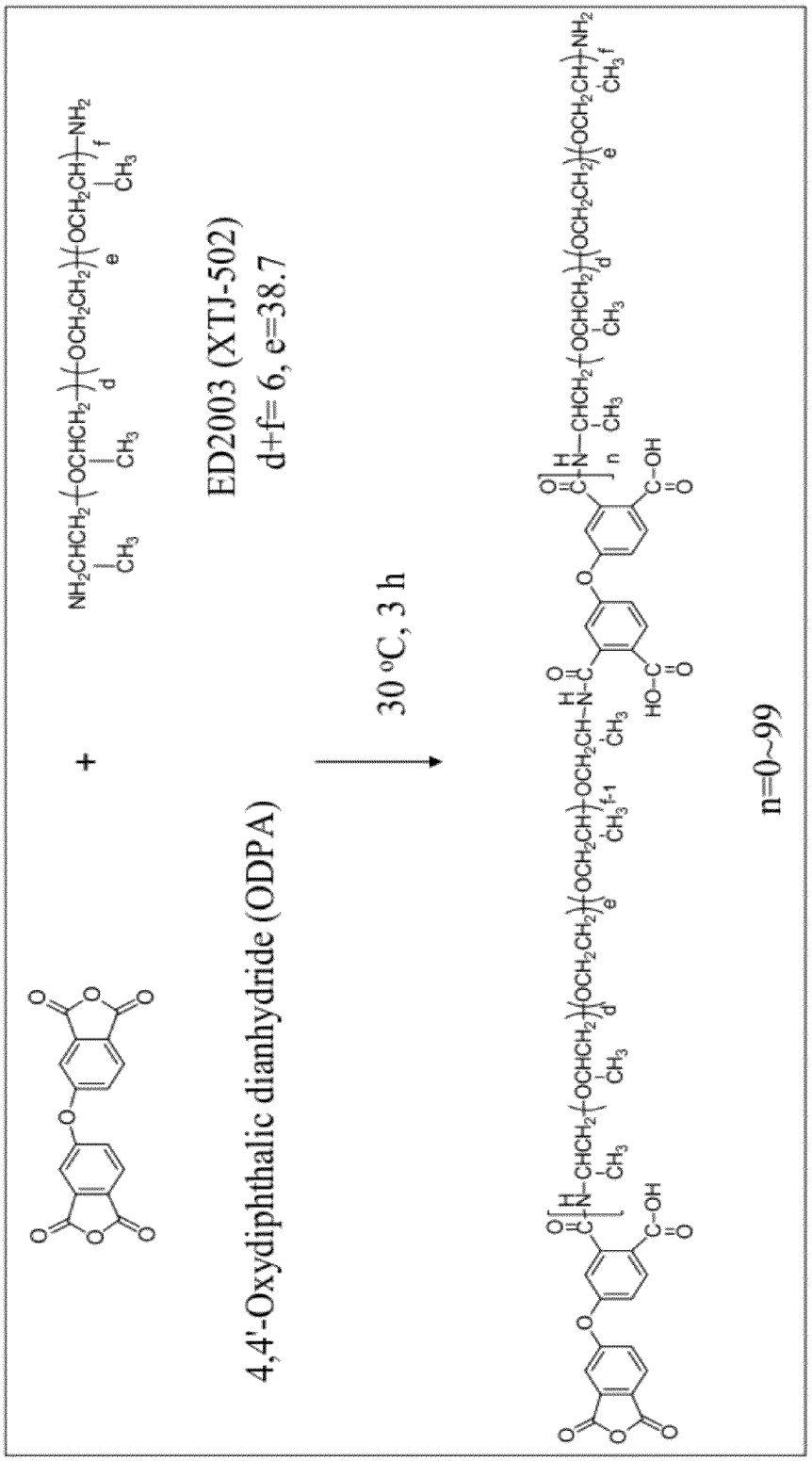
FIG. 5 shows the reaction scheme for synthesizing ODPA/ED2003 amide copolymer.

In a 100 ml three-necked bottle, THF (10 ml) was added and then ED2003 (10 g, 0.005 mol) was dissolved therein. 4,4'-Oxydiphthalic dianhydride (ODPA) (1.55 g, 0.005 mol) was then added so that the molar ratio of ODPA/ED2003 was 1/1. The mixture was mechanically blended and reacted in nitrogen at 30° C. for 3 hours. The mixture was sampled at intervals for IR analysis until the characteristic peak of the anhydride groups disappeared and amide groups generated. After the reaction completed, THF was removed by vacuum filtration and the product ED2003/ODPA copolymer was a light yellow viscous solid. FIG. 5 shows the reaction. ATTACHMENT 3 shows the solubilities of the ODPA/ED2003 amide copolymer in solvents.

Step (B) Synthesizing Silver Nanoparticles

Figure 6:
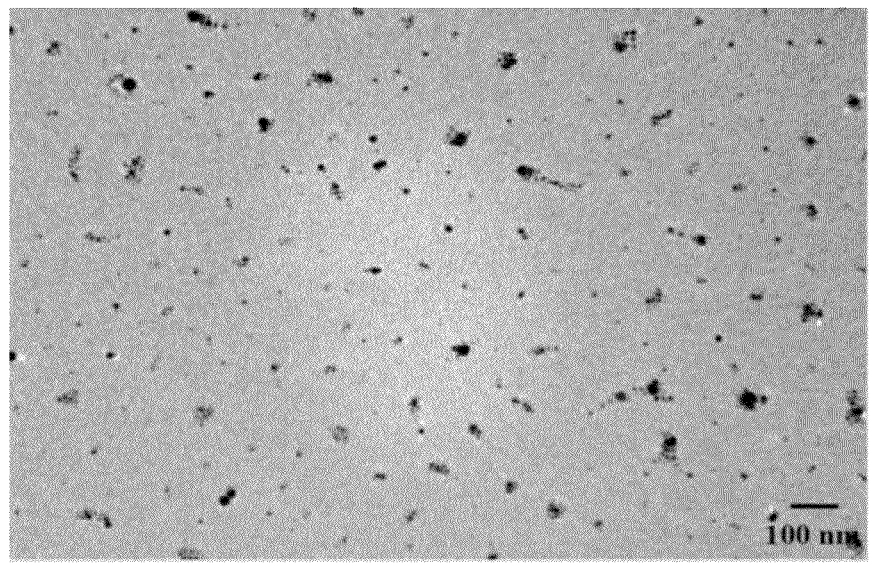
FIG. 6 shows the TEM image of the silver nanoparticles prepared from ODPA/ED2003 amide copolymer.

ODPA/ED2003 amide copolymer (0.5 g) was dissolved in water (10 g) and then $AgNO_3$ (0.5 g) was added. Through self-reductive reaction of EO segments, the silver nanoparticles were generated. With increasing concentrations of the silver nanoparticles, the solution became brown from light yellow. The UV analysis showed that the silver nanoparticles were generated according to characteristic absorption thereof at wavelength 418 nm. FIG. 6 shows the TEM image of the silver nanoparticles in which the particle sizes ranged from 5 to 25 nm.

Example 3

Repeat procedures of Example 2, except that the molar ratio of ODPA/ED2003 was changed as 2:3. ATTACHMENT 3 shows the solubilities of the ODPA/ED2003 amide copolymer in solvents. The silver nanoparticles having good thermal stability in a high concentration were prepared.

Example 4

Step (A) Synthesizing Polymeric Imide Copolymer ODPA/ED2003

Figure 7:
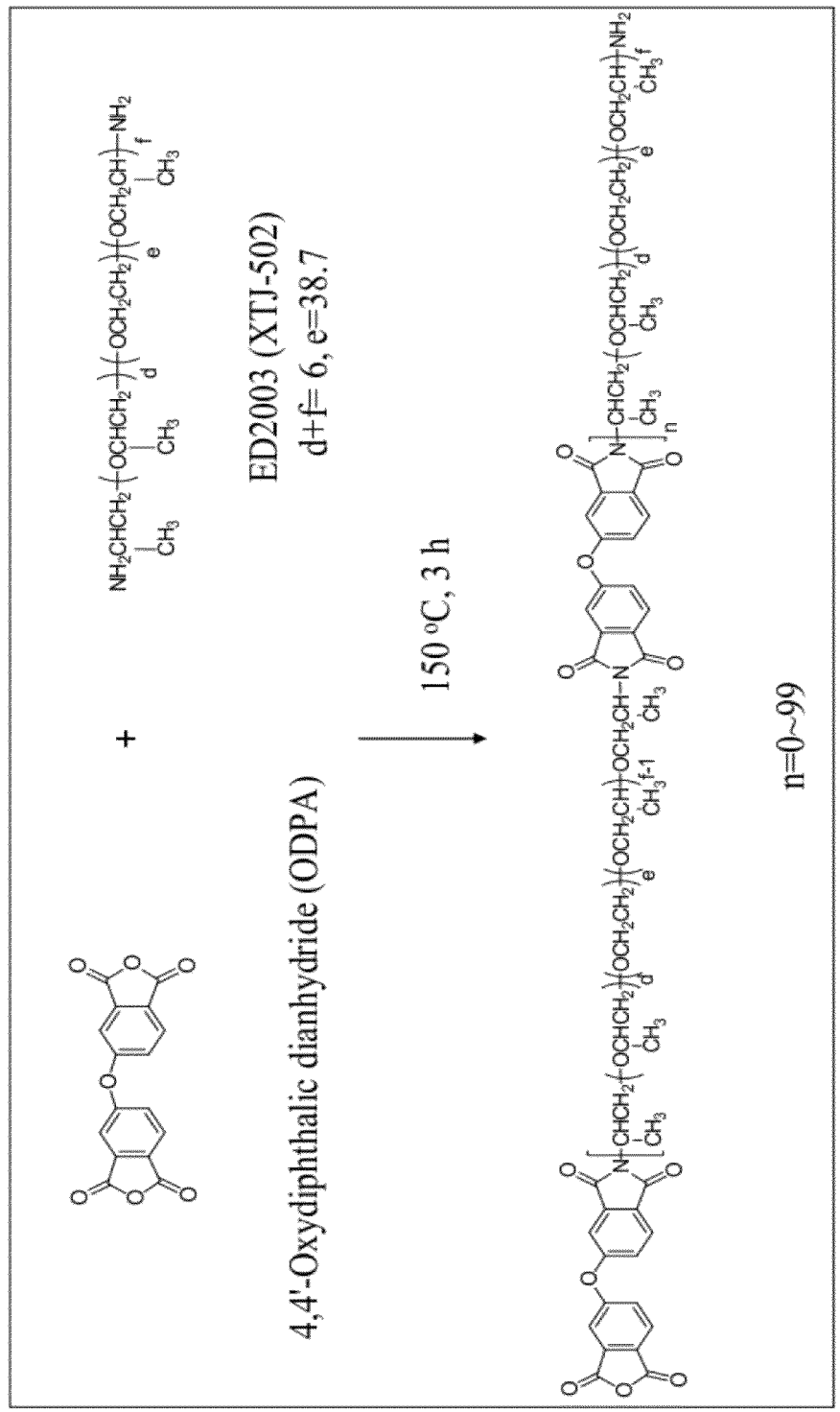
FIG. 7 shows the reaction scheme for synthesizing ODPA/ED2003 imide copolymer.

Repeat Step (A) of Example 2, except that the reaction temperature was changed to 150° C. After the reaction completed, polymeric copolymer ODPA/ED2003 having imide group was generated and was a light yellow viscous solid. FIG. 7 shows the reaction. ATTACHMENT 3 shows the solubilities of the ODPA/ED2003 imide copolymer.

Step (B) Synthesizing Silver Nanoparticles

Figure 8:
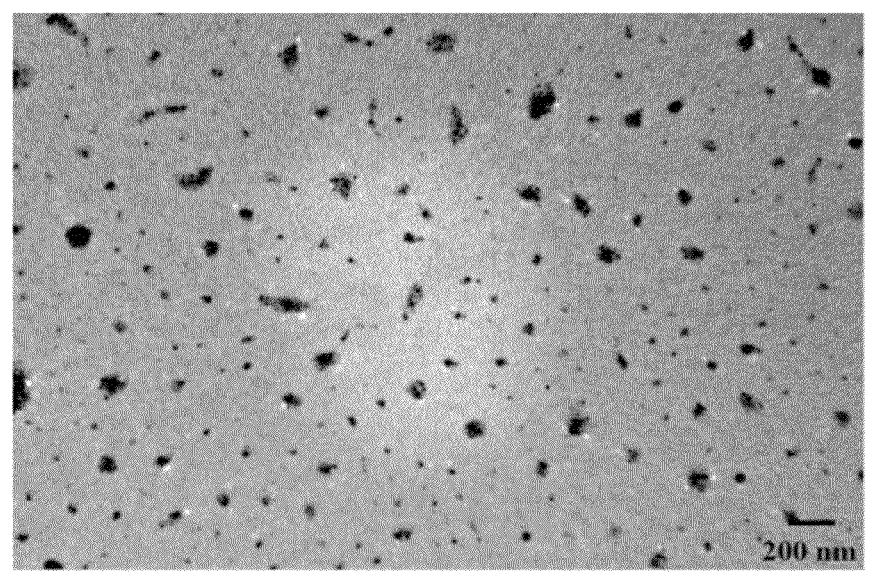
FIG. 8 shows the TEM image of the silver nanoparticles prepared from ODPA/ED2003 imide copolymer.

ODPA/ED2003 imide copolymer (0.5 g) was dissolved in water (10 g) and then $AgNO_3$ (0.5 g) was added. Through self-reductive reaction of EO segments, the silver nanoparticles were generated. With increasing concentrations of the silver nanoparticles, the solution became brown from light yellow. The UV analysis showed that the silver nanoparticles were generated according to characteristic absorption thereof at wavelength 421 nm. FIG. 8 shows the TEM image of the silver nanoparticles in which the particle sizes ranged from 7 to 35 nm.

Examples 5~6

Repeat procedures of Example 4, except that the molar ratios of ODPA/ED2003 were changed as 2:3 and 5:6, respectively. Solubilities of ODPA/ED2003 imide copolymer in solvents are shown in ATTACHMENT 3. The silver nanoparticles having good thermal stability in a high concentration were prepared.

Comparative Example 1

Step (A) Synthesizing Polymeric Polyamine BE188/ED2003

Figure 9:
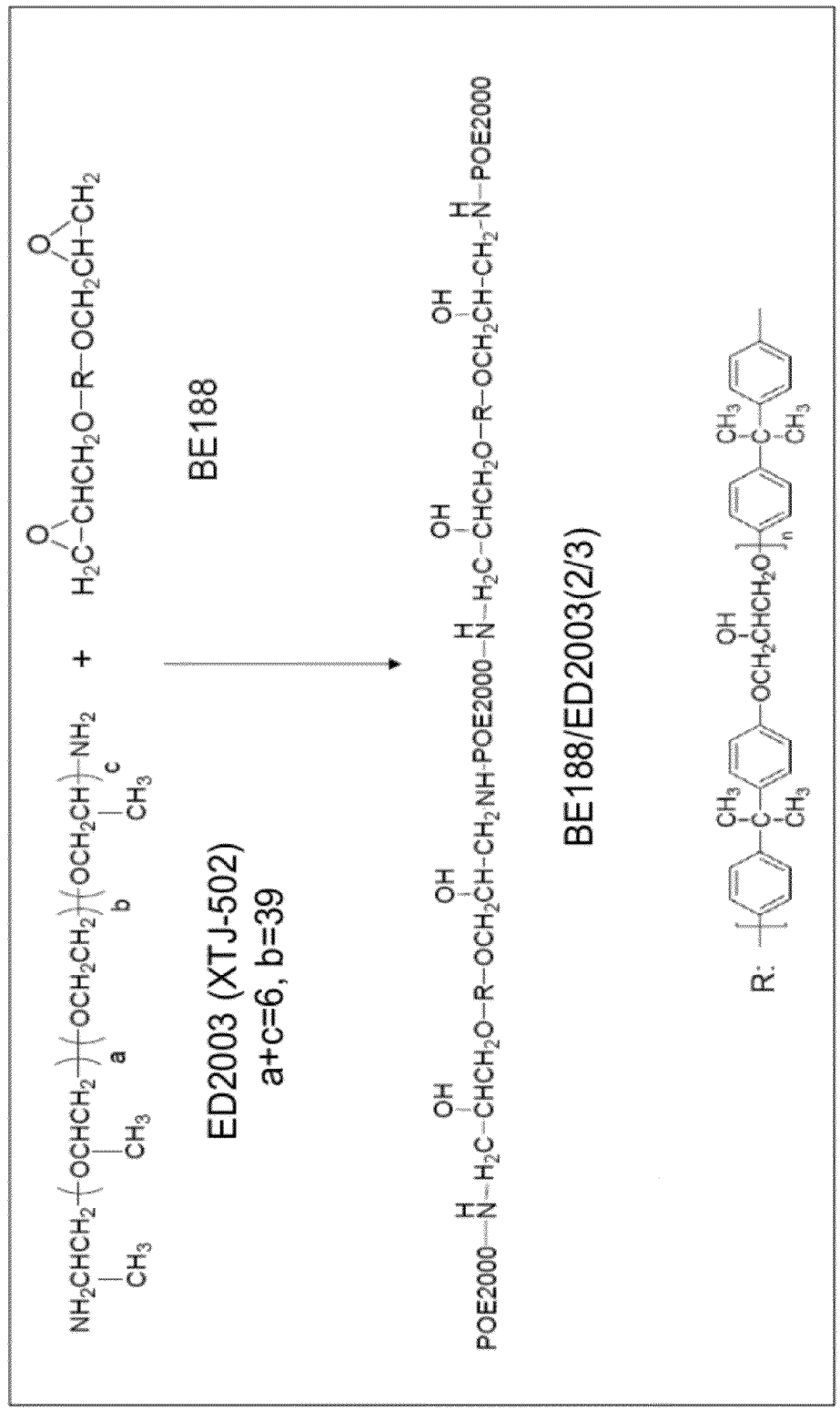
FIG. 9 shows the reaction scheme for synthesizing BE188/ED2003 polymeric polyamine.

ED2003 was dewatered in vacuum at 120° C. for 6 hours. In a 500 ml three-necked bottle, diglycidyl ether of bisphenol A (BE188) (7 g, 0.02 mol) and ED2003 (60 g, 0.03 mol) were added so that the molar ratio of BE188/ED2003 was 2:3. The mixture was mechanically mixed and reacted in nitrogen at 150° C. for more than 5 hours. The mixture was sampled at intervals for IR analysis until the characteristic peak of the epoxy group disappeared on FT-IR spectrum. After the reaction completed, the product, a light yellow viscous liquid, was observed. FIG. 9 shows the reaction.

Step (B)

BE188/ED2003 and $AgNO_3$ were mixed and reacted. A significant amount of silver particles precipitated on the bottom of the bottle. Thus, the stabilizers (or dispersants) synthesized according to the present invention were necessary.

Comparative Example 2

Step (A) Synthesizing Polymeric Polyamine BE188/M2070

Figure 10:
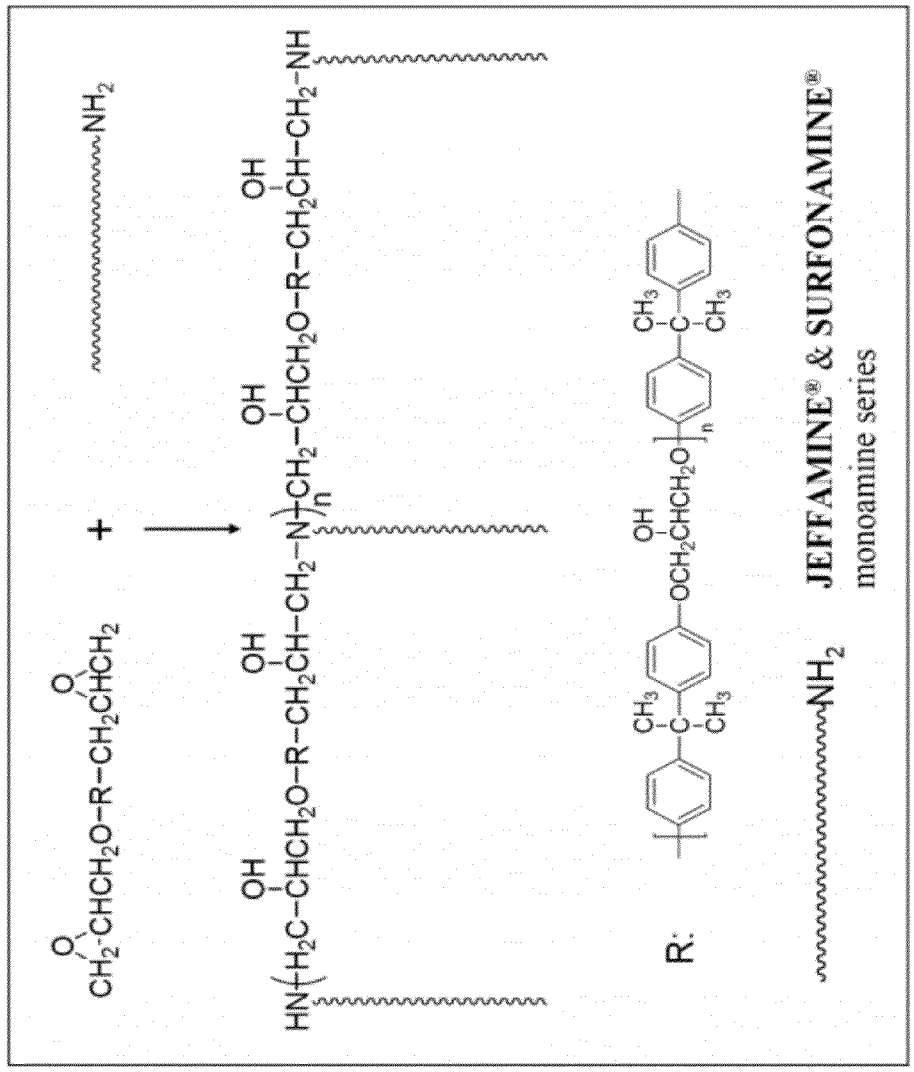
FIG. 10 shows the reaction scheme for synthesizing BE188/M2070 polymeric polyamine.

M2070 was dewatered in vacuum at 120° C. for 6 hours. In a 500 ml three-necked bottle, BE188 (7 g, 0.02 mol) and M2070 (60 g, 0.03 mol) were added so that the molar ratio of BE188/M2070 was 2:3. The mixture was mechanically mixed and reacted in nitrogen at 150° C. for more than 5 hours. The mixture was sampled at intervals for IR analysis until the characteristic peak of the epoxy group disappeared on FT-IR spectrum. After the reaction completed, the product, a light yellow viscous liquid, was observed. FIG. 10 showed the reaction.

In replacement of M2070, other Jeffamine® series compounds including M1000, L200 and L300 were used in the above reaction and the results were the same.

Step (B)

BE188/M2070 and $AgNO_3$ were mixed and reacted. Although the silver ions were stable, they could not be reduced into silver nanoparticles unless a strong reducing agent such as $NaBH_4$ was added. Thus, the stabilizers synthesized according to the present invention were necessary.

Comparative Example 3

Poly(oxyethylene)-amine (ED2003) was used as the stabilizer to reduce silver ions, and finally the silver precipitated and aggregated. This showed that the stabilizers synthesized according to the present invention were necessary.

Operation conditions of the above Examples and Comparative Examples were listed in ATTACHMENT 4.

Preparing the Concentrative Dispersions of the Silver Nanoparticles

After being stabilized with polymeric polyamines of the present invention, the silver nanoparticles could be further concentrated by a water-jet concentrator or a freezing dryer to increase the concentration thereof to at least 10 wt %. The concentrative dispersions also could be diluted in a solvent again.

According to the above description, features of the present invention are summarized as follows:

1. The polymeric polymers can act as both a reducing agent and a stabilizer (or dispersant) in preparing the silver nanoparticles.
2. The molar ratios of polymeric polymers to silver can be controlled to limit the silver particles at nanoscale, generally about 100 nm, and even smaller than 10 nm.
3. The silver nanoparticles can be uniformly and stably dispersed in much higher concentrations than the commercial silver products and can be further concentrated to form a silver paste which can be dispersed in a medium again. The medium can be a hydrophilic solvent such as water or a hydrophobic organic solvent such as methanol, ethanol, IPA, acetone, THF, MEK, toluene, and the like.
4. The silver nanoparticles can be blended in organic polymers at nanoscale to form composites of good electrical conductivity or germproof effects. The organic polymers can be polyimide (PI), epoxy, nylon, polypropylene (PP), acrylonitrile butadiene styrene (ABS), polystyrene (PS), and the like.

ATTACHMENT 1

JEFFAMINE MONOAMINES (M series)

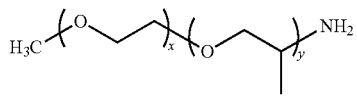

R = H for (EO), or $CH_3$ for (PO)

| JEFFAMINE | PO/EO mol ratio | MW |
|---|---|---|
| M-600 (XTJ-505) | 9/1 | 600 |
| M-1000 (XTJ-506) | 3/19 | 1000 |
| M-1000 (XTJ-507) | 29/6 | 2000 |
| M-2070 | 10/31 | 2000 |

JEFFAMINE DIAMINES (D series)

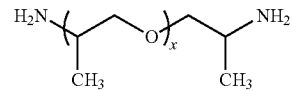

| JEFFAMINE | x | MW |
|---|---|---|
| D-230 | ~2.5 | 230 |
| D-400 | ~6.1 | 430 |
| D-2000 | ~33 | 2,000 |
| D-4000 (XTJ-510) | ~68 | 4,000 |

JEFFAMINE DIAMINES (ED Series)

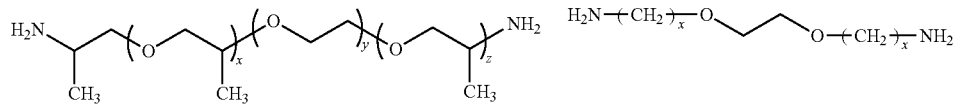

| JEFFAMINE | y | x + z | MW |
|---|---|---|---|
| HX-511 | 2.0 | ~1.2 | 220 |
| ED-600 (XTJ-500) | ~9.0 | ~3.6 | 600 |
| ED900 (XTJ-501) | ~12.5 | ~6.0 | 900 |
| ED2003 (XTJ-502) | ~39 | ~6.0 | 2000 |

JEFFAMINE DIAMINES (EDR Series)

| JEFFAMINE | x | MW |
|---|---|---|
| EDR-148 (XTJ-504) | 2.0 | 600 |
| EDR-176 (XTJ-590) | 3.0 | 900 |

-continued

| JEFFAMINE TRIAMINES (T Series) | | | | | JEFFAMINER Secondary Amines (SD Series, ST Series) | | |
|---|---|---|---|---|---|---|---|
| JEFFAMINE | R | n | Moles PO (x + z + z) | MW | JEFFAMINE | Base Product | MW |
| T-403 | $C_2H_5$ | 1 | 5-6 | 440 | SD-231 (XTJ-584) | D-230 | 315 |
| T-3000 (XTJ-509) | H | 0 | 50 | 3000 | SD-401 (XTJ-585) | D-400 | 515 |
| T-5000 | H | 0 | 85 | 5000 | SD-2001 (XTJ-576) | D-2000 | 2050 |
| | | | | | SD-404 (XTJ-586) | T-403 | 565 |

ATTACHMENT 2

| Dianhydride | CAS No. | Molecular weight | m.p. (° C.) |
|---|---|---|---|
| 3,3′,4,4′-Benzophenone tetracarboxylic dianhydride (BTDA) | 2421-28-5 | 322.22 | 225 |
| Pyromellitic dianhydride (PMDA) | 89-32-7 | 218.12 | 285 |
| 3,3′,4,4′-Biphenyl tetracarboxylic dianhydride s-(BPDA) | 2420-87-3 | 294.2 | 300 |
| 4,4′-(Hexafluoroisopropylidene) diphthalic anhydride (6FDA) | 1107-00-2 | 444.2 | 246.5 |

-continued

ATTACHMENT 2

| Dianhydride | CAS No. | Molecular weight | m.p. (° C.) |
|---|---|---|---|
| 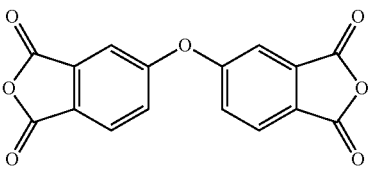  4,4'-Oxydiphthalic dianhydride (ODPA) | 1823-59-2 | 310.2 | 226-227 |
| 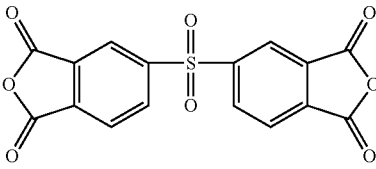  3,3',4,4'-Diphenylsulfone tetracarboxylic dianhydride (DSDA) | 2540-99-0 | 358 | 287-288 |
| 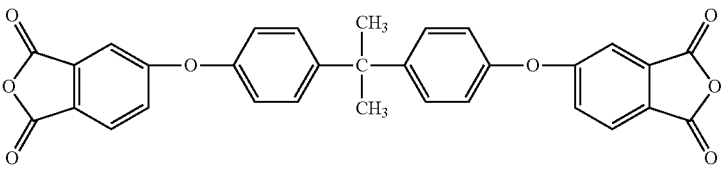  4,4'-Biphenol A dianhydride (BPADA) | 38103-06-9 | 520.49 | 172 |
| 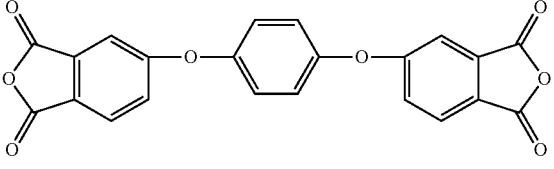  Hydroquinone diphthalic anhydride (HQDA) | 17828-53-4 | 402.31 | 260-264 |

ATTACHMENT 3

|  |  | Example | | | | |
|---|---|---|---|---|---|---|
|  |  | 2 | 3 | 4 | 5 | 6 |
| OPDA/ED2003 Copolymer | | 1/1 amide | 2/3 amide | 1/1 imide | 2/3 imide | 5/6 imide |
| Solvent | Water | + | + | + | + | + |
|  | Ethanol | + | + | + | + | + |
|  | Acetone | + | + | + | + | + |
|  | PGMEA | − | − | + | + | + |
|  | Toluene | + | + | + | + | + |
|  | NMP | + | + | + | + | + |
|  | THF | + | + | + | + | + |
|  | Ethylene glycol | + | + | − | − | − |
|  | Glycerin | + | + | − | + | − |

PGMEA: propylene glycol monomethyl ether acetate
NMP: N-methyl-2-pyrrolidone
+: soluble
−: insoluble

ATTACHMENT 4

| | Polymeric polymer | | | |
|---|---|---|---|---|
| Example/ Comparative Example | Composition Reaction temperature and time | Molar ratio | AgNO$_3$/ dispersant (w/w) | UV absorbance or results |
| Example 1 | SMA/M2070 | 1/2 | 2/5 | 460 |
| Example 2 | OPDA/ED2003 30° C., 3 hours | 1/1 | 1/1 | 418 |
| Example 3 | OPDA/ED2003 30° C., 3 hours | 2/3 | 1/1 | 423 |
| Example 4 | OPDA/ED2003 150° C., 3 hours | 1/1 | 1/1 | 421 |
| Example 5 | OPDA/ED2003 150° C., 3 hours | 2/3 | 1/1 | 420 |
| Example 6 | OPDA/ED2003 150° C., 3 hours | 5/6 | 1/1 | 426 |
| Comparative Example 1 | BE188/ED2003 150° C., >5 hours | 2/3 | 1/4 | Silver particles precipitating |

-continued

ATTACHMENT 4

| Example/Comparative Example | Composition Reaction temperature and time | Molar ratio | AgNO₃/dispersant (w/w) | UV absorbance or results |
|---|---|---|---|---|
| Comparative Example 2 | BE188/M2070 150° C., >5 hours | 2/3 | 1/4 | No reaction |
| Comparative Example 3 | ED2003 | | 1/1 | Silver particles precipitating |

What is claimed is:

1. A method for producing silver nanoparticles, comprising the steps of:
   (A) synthesizing a polymeric polymer from poly(oxyalkylene)-amine and a linker, wherein the linker is poly(styrene-co-maleic anhydride) (SMA) or dianhydride, and the poly(oxyalkylene)-amine contains a reductive poly(oxyethylene) segment; and
   (B) reacting the polymeric polymer and silver ions in a second solvent to reduce the silver ions to silver atoms which are dispersed as silver nanoparticles.

2. The method of claim 1, wherein step (A) is performed in a first solvent.

3. The method of claim 2, wherein the first solvent is tetrahydrofuran (THF), N-methyl-2-pyrrolidone (NMP), dimethyl formamide (DMF), toluene, acetone, propylene glycol monomethyl ether acetate (PGMEA), or methyl-ethyl ketone (MEK).

4. The method of claim 1, wherein the poly(oxyalkylene)-amine is poly(oxyalkylene)-monoamine, poly(oxyalkylene)-diamine, or poly(oxyalkylene)-triamine.

5. The method of claim 1, wherein the SMA has a molecular weight ranging from 5,000 to 150,000.

6. The method of claim 1, wherein the dianhydride is 3,3',4,4'-Benzophenone tetracarboxylic dianhydride (BTDA), pyromellitic dianhydride (PMDA), 3,3',4,4'-biphenyl tetracarboxylic (s-BPDA), 4,4'-(hexafluoroisopropylidene)diphthalic anhydride (6FDA), 4,4'-oxydiphthalic dianhydride (ODPA), 3,3',4,4'-diphenylsulfone tetracarboxylic dianhydride (DSDA), 4,4'-biphenol A dianhydride (BPADA), or hydroquinone diphthalic anhydride (HQDA).

7. The method of claim 1, wherein the dianhydride is 4,4'-oxydiphthalic dianhydride (ODPA).

8. The method of claim 1, wherein the molar ratio of the amino group of the poly(oxyalkylene)-amine to the anhydride group of the SMA ranges from 1/1 to 1/5.

9. The method of claim 1, wherein the molar ratio of the amino group of the poly(oxyalkylene)-amine to the anhydride group of the dianhydride ranges from 2/1 to 1/5.

10. The method of claim 1, wherein the silver ions are provided by AgNO₃ and the weight ratio of polymeric polymer/AgNO₃ ranges from 1/99 to 99/1.

11. The method of claim 1, wherein the second solvent is water, dimethyl formamide (DMF), N-methyl-2-pyrrolidone (NMP), or tetrahydrofuran (THF).

12. The method of claim 1, further comprising:
    (C) removing part or all of the second solvent, so that the solid content of the silver nanoparticles ranges from 30 to 100 wt %.

13. The method of claim 12, further comprising:
    (D) adding an organic solvent to disperse the silver nanoparticles therein.

14. The method of claim 1, wherein the polymeric polymer has the following structural formula:

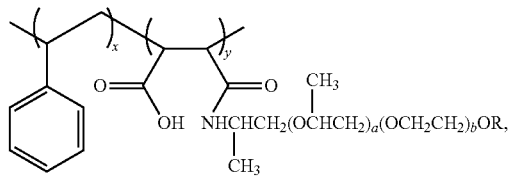

wherein
x/y=1/1~11/1, a=10, b=32, and R=CH₃;

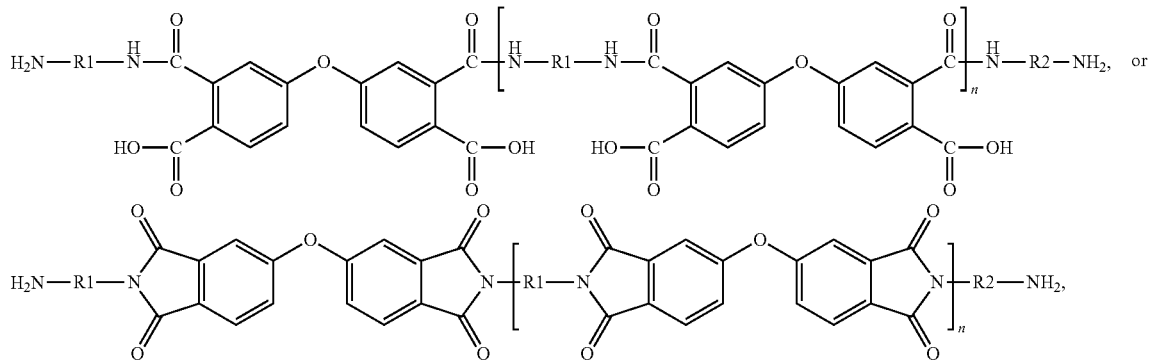

wherein

R1 =

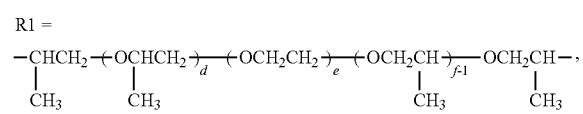

R2 =

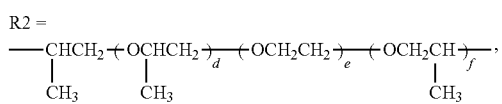

d+f=6, e=38.7, and n=0~99.

* * * * *